United States Patent
Yoo et al.

(10) Patent No.: US 9,514,806 B2
(45) Date of Patent: *Dec. 6, 2016

(54) AUTO LOW CURRENT PROGRAMMING METHOD WITHOUT VERIFY

(71) Applicant: Integrated Silicon Solution, Inc., Milpitas, CA (US)

(72) Inventors: Sung Jin Yoo, San Jose, CA (US); Guowei Wang, San Jose, CA (US)

(73) Assignee: Integrated Silicon Solution, Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/799,915

(22) Filed: Jul. 15, 2015

(65) Prior Publication Data

US 2016/0019950 A1 Jan. 21, 2016

Related U.S. Application Data

(63) Continuation of application No. 14/225,202, filed on Mar. 25, 2014, now Pat. No. 9,117,549.

(51) Int. Cl.
| | |
|---|---|
| *G11C 16/06* | (2006.01) |
| *G11C 11/56* | (2006.01) |
| *G11C 16/10* | (2006.01) |
| *G11C 16/34* | (2006.01) |
| *G11C 16/08* | (2006.01) |
| *G11C 16/28* | (2006.01) |

(52) U.S. Cl.
CPC ........ *G11C 11/5628* (2013.01); *G11C 11/5642* (2013.01); *G11C 16/08* (2013.01); *G11C 16/10* (2013.01); *G11C 16/28* (2013.01); *G11C 16/3454* (2013.01); *G11C 16/3468* (2013.01); *G11C 2211/5622* (2013.01); *G11C 2211/5624* (2013.01); *G11C 2211/5625* (2013.01)

(58) Field of Classification Search
CPC .................................................... G11C 16/28
USPC ......................... 365/185.03, 185.19, 185.21
See application file for complete search history.

(56) References Cited

U.S. PATENT DOCUMENTS 9,117,549 B1 * 8/2015 Yoo ...................... G11C 11/5628

\* cited by examiner

*Primary Examiner* — Hoai V Ho
(74) *Attorney, Agent, or Firm* — Van Pelt, Yi & James LLP

(57) ABSTRACT

A flash memory device employs a low current auto-verification programming scheme using multi-step programming voltage and cell current detection. The low current auto-verification programming scheme performs programming of memory cells by the application of programming voltages in step increments. For each programming pulse, the cell current of the memory cell is sensed to determine when the memory cell is programmed. The programming pulse is terminated when the cell current decreases below a reference current level.

11 Claims, 6 Drawing Sheets

AUTO LOW CURRENT PROGRAMMING METHOD WITHOUT VERIFY

CROSS REFERENCE TO OTHER APPLICATIONS

This application is a continuation of U.S. patent application Ser. No. 14/225,202, entitled AUTO LOW CURRENT PROGRAMMING METHOD WITHOUT VERIFY, filed Mar. 25, 2014, now U.S. Pat. No. 9,117,549, issued Aug. 25, 2015, which is incorporated herein by reference for all purposes.

BACKGROUND OF THE INVENTION

Non-volatile memory (NVM) is a memory device that retains content stored therein even when power is removed. EEPROM and flash memory are two commonly used non-volatile memory devices. In particular, flash memory has become widely used in electronic devices, especially portable electronic devices, because of its ability to provide data storage at low power levels. Modern day flash memory devices are typically implemented using a floating gate MOS transistor device as the memory cells. A floating gate MOS transistor device includes a floating gate that is formed between a control gate and the channel region (the substrate) of the MOS device and at least partially vertically aligned with the control gate. Charge storage on the floating gate determines the stored data state ("0" or "1") of the memory cell.

In a non-volatile memory cell implemented using a floating gate MOS device, programming of the memory cell, or writing data to the memory cell, is accomplished by transferring charge carriers from the semiconductor substrate (the source or the drain) to the floating gate by tunneling through the thin gate oxide layer. Typically, a block of non-volatile memory cells is first erased by applying bias conditions to remove the charges stored on the floating gate. Then, the non-volatile memory cells can be written or programmed, usually one byte or word at a time, by applying the bias conditions opposite to the erase operation. Erase and programming operation of non-volatile memory devices require a relatively large voltage and current and erase and programming cycles can be slow.

Furthermore, programming of the non-volatile memory device is typically carried out using a program and program-verify cycle. The memory cells are programmed using the programming bias condition and then the cells are verified by reading the programmed states of the cells using the read bias condition. If a memory cell fails the program-verification, the programming operation is repeated and the memory cells are again verified. When the memory device ages, the program and program-verify cycle may need to be repeated many times in order to program the device.

BRIEF DESCRIPTION OF THE DRAWINGS

Various embodiments of the invention are disclosed in the following detailed description and the accompanying drawings.

DETAILED DESCRIPTION

Figure 1:
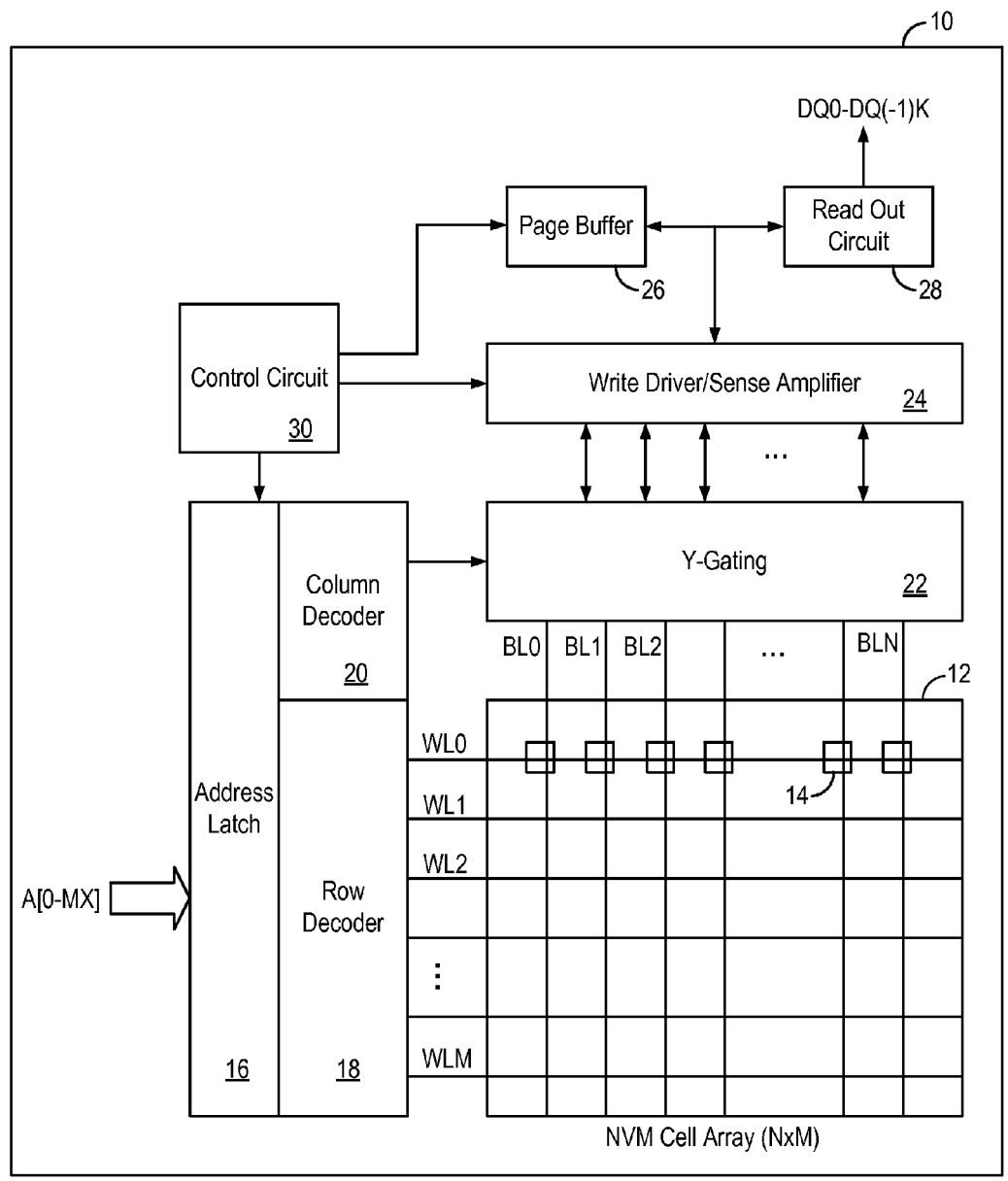
FIG. 1 is a block diagram of a non-volatile memory (NVM) device in one exemplary embodiment.

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In embodiments of the present invention, a flash memory device employs a low current auto-verification programming scheme using multi-step programming voltage and cell current detection. The low current auto-verification programming scheme performs programming of memory cells in the flash memory device by the application of programming voltages in step increments. The cell current of the memory cell is detected to determine when the memory cell is programmed so that a separate program-verify step may be eliminated. As thus configured, the programming time for the flash memory device is reduced significantly while the programming current demand is also reduced.

The low current auto-verification programming scheme for flash memory device achieves many advantages over conventional flash memory programming methods. First, by using multi-step programming voltages, the flash memory device can be programmed with low programming current. Second, the flash memory device can be programmed without the need to perform program verify operations. Eliminating the program-verify operation results in significant reduction in programming time as the need to switch between applying the programming bias condition and the read bias condition for verification is eliminated.

Flash memory devices can be constructed using single-level memory cells (SLC) which store a single bit of data per memory cell. Flash memory devices can also be constructed using multi-level memory cells (MLC) which are capable of storing two or more bits of data per memory cell, thereby providing increased bit density and the capacity of the flash memory device. A SLC flash memory device is programmed by raising the threshold voltage of the memory cell above a given thresholds. A MLC flash memory device is programmed by setting the threshold voltage to one of multiple distinct valid programmed threshold voltage ranges. For example, for a storage element storing two bits of data—the memory is placed in one of four discrete charge bands corresponding to four distinct threshold voltage ranges. The low current auto-verification programming scheme of the present invention can be applied to a SLC flash memory device or a MLC flash memory device.

FIG. 1 is a block diagram of a non-volatile memory (NVM) device in one exemplary embodiment. FIG. 1 is illustrative only and the NVM device may include additional components not shown in FIG. 1. Referring to FIG. 1, the NVM device 10 includes a two-dimensional array 12 of non-volatile memory cells 14. In the present embodiment, NVM device 10 is implemented as a flash memory device and non-volatile memory cells 14 are implemented as flash memory cells. In other embodiments, the NVM device 10 may be implemented as other types of non-volatile memory device.

In embodiments of the present invention, flash memory cells 14 may be configured as a NAND flash memory array or a NOR flash memory array. The cell array 12 is addressed by a row decoder 18 and a column decoder 20 to selectively access the memory cells 14 for read, program (write) and erase operations. In particular, an address A[0-MX] is received at an address latch 16 and the received address is decoded by the row decoder 18 which selects the word lines and the column decoder 20 which selects the bit lines of the memory array 12. The flash memory cells 14 in the array 12 are accessed by word lines WL0 to WLM and bit lines BL0 and BLN. The row decoder 18 selectively activates a word line from WL0 to WLM. The column decoder selectively activates a bit line from BL0 to BLN through the Y-gating circuit 22 to allow a memory cell 14 at the intersection of the selected word line and selected bit line to be accessed. To read data from or write data to the memory array 12, the Y-gating circuit 22 connects the bit lines to a write driver/sense amplifier circuit 24. In practice, the write driver and sense amplifier circuit 20 includes a bank of write drivers and sense amplifiers, one set of write driver and sense amplifier for each input/output (I/O) of the flash memory device. Each set of write driver and sense amplifier is coupled to a block of memory cells 14 in the cell array 12. For example, when the flash memory device 10 generates output data in K-bit (i.e. K-bit I/O), the write driver/sense amplifier circuit 24 may include K write drivers and K sense amplifiers, each write driver/sense amplifier circuit being coupled to a block of bits lines associated with a databit of the output data. The write driver and sense amplifier circuit 20 may be coupled to a page buffer 26 to receive program data to be written into the cell array 12 and may be further coupled to a read out circuit to provide data read out from the cell array 12 to external circuits. The memory architecture shown in FIG. 1 is illustrative only and it will be appreciated that the structure and methods described herein may be utilized in other memory architectures.

Figure 2:
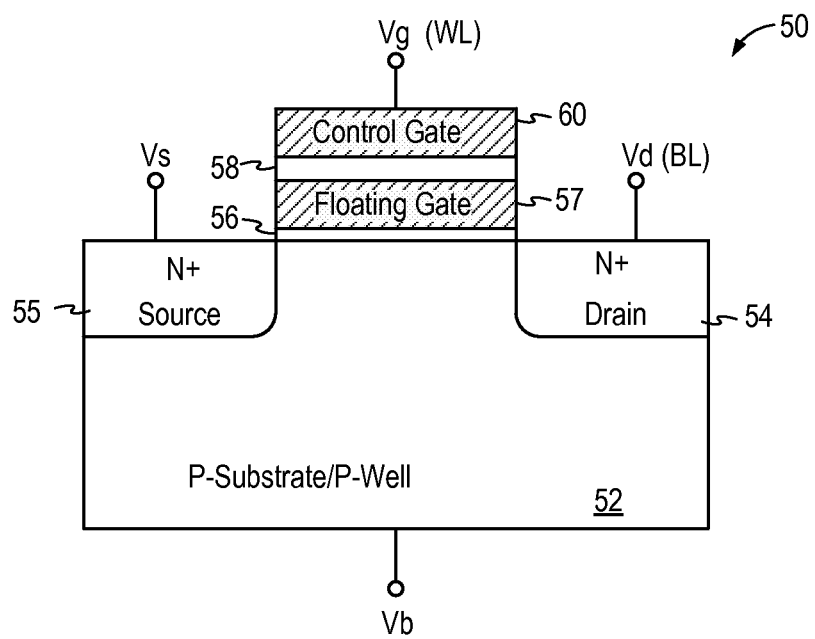
FIG. 2 is a cross-sectional view of a flash memory cell implemented using a floating gate MOS transistor device in some examples of the present invention.

In the present embodiment, flash memory cells 14 are implemented using a floating gate MOS transistor device, as shown in FIG. 2. Referring to FIG. 2, a floating gate MOS transistor device 50 includes a source region 55, a drain region 54, a control gate 60 and a floating gate 57. The source and drain regions are formed in a semiconductor layer 52 with the channel region disposed in between the source and the drain regions. In some examples, the semiconductor layer 52 can be a well region or a semiconductor substrate. In the present example, the floating gate MOS transistor device 50 is formed as an N-type device and the semiconductor layer 52 is a P-type well region with the source and drain regions being heavily doped N+ regions formed in the P-well region 52. The floating gate 57 and the control gate 60 are vertically disposed above the channel region and at least partially overlapped. The floating gate 57 is electrically isolated from the P-type well region 52 by a thin gate oxide layer 56 (also referred to as the "tunnel oxide layer") and is electrically isolated from the control gate 60 by another dielectric layer 58 which can be a dielectric film or a stack of different dielectric films. The control gate 60 of the floating gate MOS transistor device 50 is coupled to the word line of the cell array while the drain region is coupled to the bit line of the cell array. In a NOR flash memory, the source regions of the floating gate MOS transistor devices are connected to a shared source line which is typically connected to the ground potential.

The operation of the flash memory device 10 and the floating gate flash memory cell 50 is well known and will be described in brief. In the present example, the flash memory cell is adapted to store one bit of data. The flash memory cell has a logical state of "1" when the cell is erased and a logical state of "0" when the cell is programmed. It is understood that flash memory cells may be constructed to operate in the opposite logical states.

First, programming or writing data to the flash memory cell is performed by transferring charge carriers from the semiconductor layer 52 to the floating gate 57 by tunneling through the thin gate oxide layer 56. For example, an elevated gate voltage (e.g. $V_g=12V$) is applied to the control gate to turn on the channel and electrons can flow from the source to the drain. The P-well region 52 is typically grounded. An elevated drain voltage (e.g. $V_d=5V$) is applied to the drain region 54 relative to the source region 55 to generate electrons with sufficiently high energy ("hot electrons") so that hot electronic injection occurs and hot electrons jump through the thin gate oxide layer 56 onto the floating gate 57. When the biasing voltages are removed, the charges are trapped on the floating gate 57 and the memory cell is programmed to a logical state of 0.

Second, erasing the flash memory cell is performed by transferring charge carriers from the floating gate to the semiconductor layer 52 (or P-well 52) by quantum tunneling or Fowler-Nordheim tunneling. The erase operation can be carried out using source erase operation or channel erase. To perform source erase, an elevated negative voltage (e.g. $V_g=-10y$) is applied to the control gate 60 and the substrate is at ground. A positive voltage (e.g. $V_d=6V$) is applied to the source region 55 with the drain region 54 being grounded or floating. Electrons are pull off the floating gate into the source through quantum tunneling. When the floating gate is left with no charge carriers, the memory cell has a logical state of 1. To perform channel erase, an elevated negative voltage (e.g. $V_g=-10V$) is applied to the control gate 60 and a positive voltage (e.g. $V_b=5V$) is applied to the semiconductor layer or P-well 52. The source region 55 and the drain region 54 are left floating. Electrons are pull off the floating gate into the substrate through quantum tunneling. When the floating gate is left with no charge carriers, the memory cell has a logical state of 1.

Flash memory cells can be programmed individually but are usually erased as a block or a sector. Each erase operation includes the application of an erase pulse followed by an erase verify cycle to ensure that all memory cells are indeed erased. If some of the memory cells are not erased, then another erase pulse is applied and the process repeats until all memory cells are erased. In both source erase and channel erase operations, the magnitude and the duration of the voltage bias can vary and are selected to ensure that all memory cells in a sector a block are erased. In most cases, the flash memory device is erased using a repeated erase-verify operation when the memory cells are verified to be erased after an erase cycle and the erase cycle is repeated if not all memory cells are erased.

Finally, a flash memory cell is read by applying a gate voltage that is an intermediate threshold voltage of an erased memory cell and a programmed memory cell. When a flash memory cell is erased, the floating gate carries no charge and the memory cell transistor can be turned on by the application of a first threshold voltage. However, when the flash memory cell is programmed, the negative charge on the floating gate screens the electric field from the control gate, the memory cell transistor thus requires a second threshold voltage higher than the first threshold voltage to turn on. Thus, to read a flash memory cell, a gate voltage between the first and second threshold voltages are applied to the control gate and a drain voltage, smaller than the gate voltage, is applied to the drain. If a current is measured at the drain terminal, then the memory cell is not programmed and has a logical state of 1. If no current is measured at the drain terminal, then the memory cell is programmed and has a logical state of 0.

To access a flash memory cell in the cell array 12, an input address A[0-MX] (FIG. 1) is provided to flash memory device 10. The input address is latched by the address latch 16 and the latched address is divided into a row address which is coupled to the row decoder 18 and a column address which is coupled to the column decoder 20. Row decoder decodes the row address and activates one word line out of word lines WL0 to WLM and column decoder decodes the column address and activates one bit line out of bit lines BL0 to BLN. In this manner, the memory cell associated with the activated word line and the activated bit line is made available for either read, write or erase operation. In practice, the flash memory device activates the memory cells associated with all of the I/Os of the memory device. For example, the memory cells associated with one byte of data or eight I/Os, may be activated for access based on the input address. More specifically, the conventional flash memory device activates one bit line for each associated write driver/sense amplifier in the flash memory device. In the following description, the operation of the flash memory device will be described with reference to a single write driver or a single sense amplifier or a single I/O. It is understood that the flash memory device includes a bank of write drivers and a bank of sense amplifiers for a set of I/Os, such as a byte of data.

In the flash memory device 10, to read out data from a flash memory cell 14, a memory cell is selected by activating a respective word line and a respective bit line and the current that flows in the memory cell is measured. The current that flows through the memory cell is measured at the drain terminal which is coupled to the bit line. The amount of current that flows through the selected memory cell is a function of the logical state of the memory cell. In the present example, if a current above a certain threshold is measured at the drain terminal, then the memory cell is not programmed and has a logical state of 1. On the other hand, if no current is measured at the drain terminal, then the memory cell is programmed and has a logical state of 0. Drain current also flows in the memory cell during the programming operation of the memory cell. In the present description, the current that flows through a memory cell when the control gate of the memory cell is biased is referred to as the "cell current" or the "bit line current."

Figure 3:
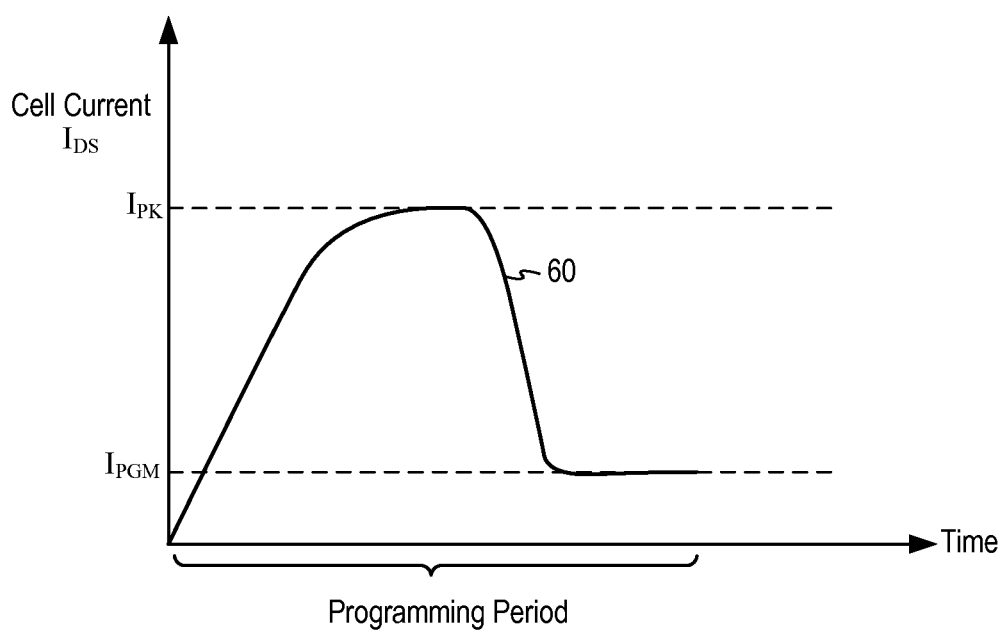
FIG. 3 illustrates the cell current of a flash memory cell during a programming operation.

FIG. 3 illustrates the cell current of a flash memory cell during a programming operation. During the programming operation of the flash memory cells, a large drain current $I_{DS}$ is drawn by the selected memory cell as a function of the programming voltage being applied to the control gate of the flash memory cell. The typical peak drain current $I_{PK}$ during programming can be on the order of 100 µA. However, after the flash memory cell is programmed, the drain current of the flash memory cell decreases dramatically even when a large gate bias is maintained at the control gate. The drain current $I_{PGM}$ of a programmed flash memory cell is usually on the order of 1-2 µA only. Therefore, it is possible to determine the program state of a flash memory cell by measuring the drain current or the cell current of the memory cell during programming of the memory cell.

Figure 4:
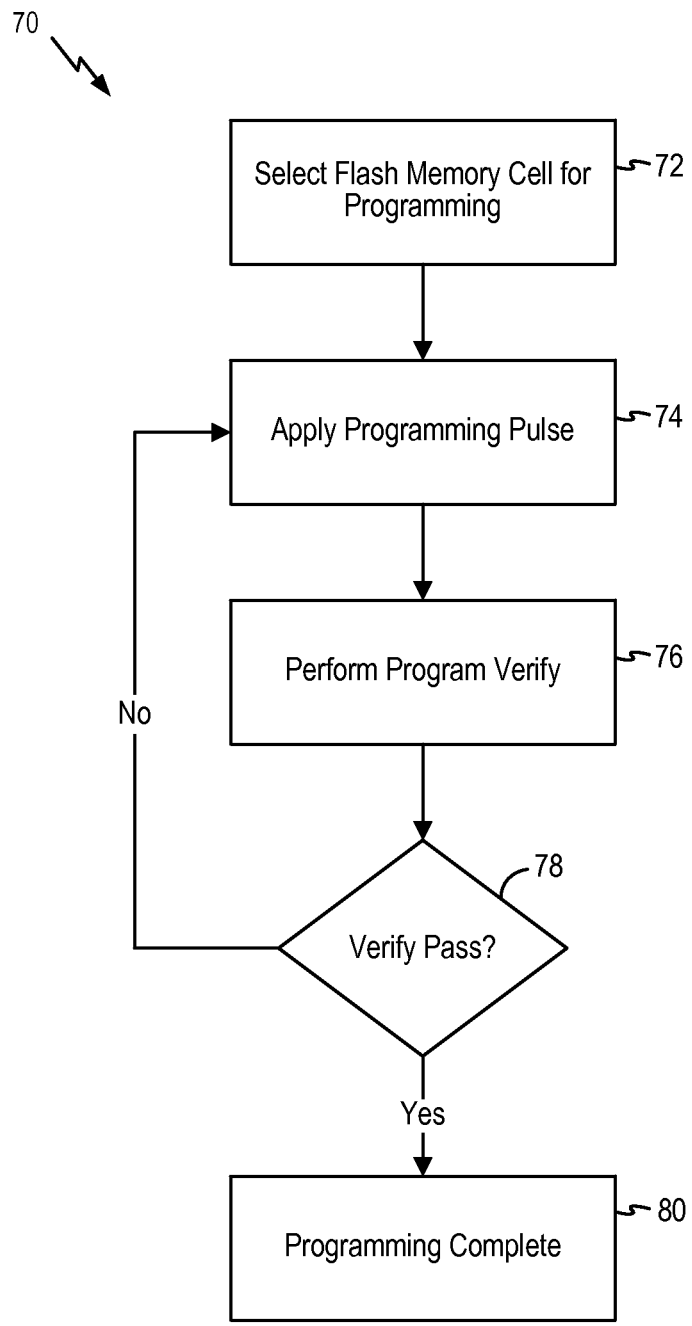
FIG. 4 is a flow chart illustrating the programming operation in a conventional flash memory device.

Conventional flash memory cell programming method involves repeated programming and program-verify cycles. FIG. 4 is a flow chart illustrating the programming operation in a conventional flash memory device. Referring to FIG. 4, in the conventional flash memory cell programming method 70, memory cells to be programmed are selected (72). Then, a programming pulse at a predetermined programming voltage is applied to the selected memory cell (74). The application of the programming pulse is referred herein as the programming operation. After the programming operation, the program state of the memory cell is verified (76). The program verify operation involves putting the selected memory cell in a read state to read out the state of the memory cell. The conventional programming method 70 then determines if the memory cell passed verification (78). If the memory cell passed verification, that is, the memory cell is verified to be in a programmed state, then the programming is completed (80). If the memory cell does not pass verification, that is, the memory cell is still in the erased state, then the programming method 70 repeats at 74 where the programming pulse is again applied to program the selected memory cell.

As described above, when the flash memory cells start to degrade, it may take many numbers of programming pulses to successfully program the memory cells. The programming process becomes time consuming as each programming cycle involves biasing the memory cells to the programming condition and then biasing the memory cells to the read condition. Furthermore, as the memory cell degrades, it is sometimes difficult to program the memory cells directly at a high programming voltage level.

In embodiments of the present invention, a low current auto-verification programming method is implemented in a flash memory device to reduce the programming time and also to reduce the current required for the programming operation. In some embodiments, the low current auto-verification programming method uses multi-step programming voltages to reduce the total current consumption and uses cell current detection for program verification. The separate program verify operation through reading of the memory cells is eliminated.

Figure 5:
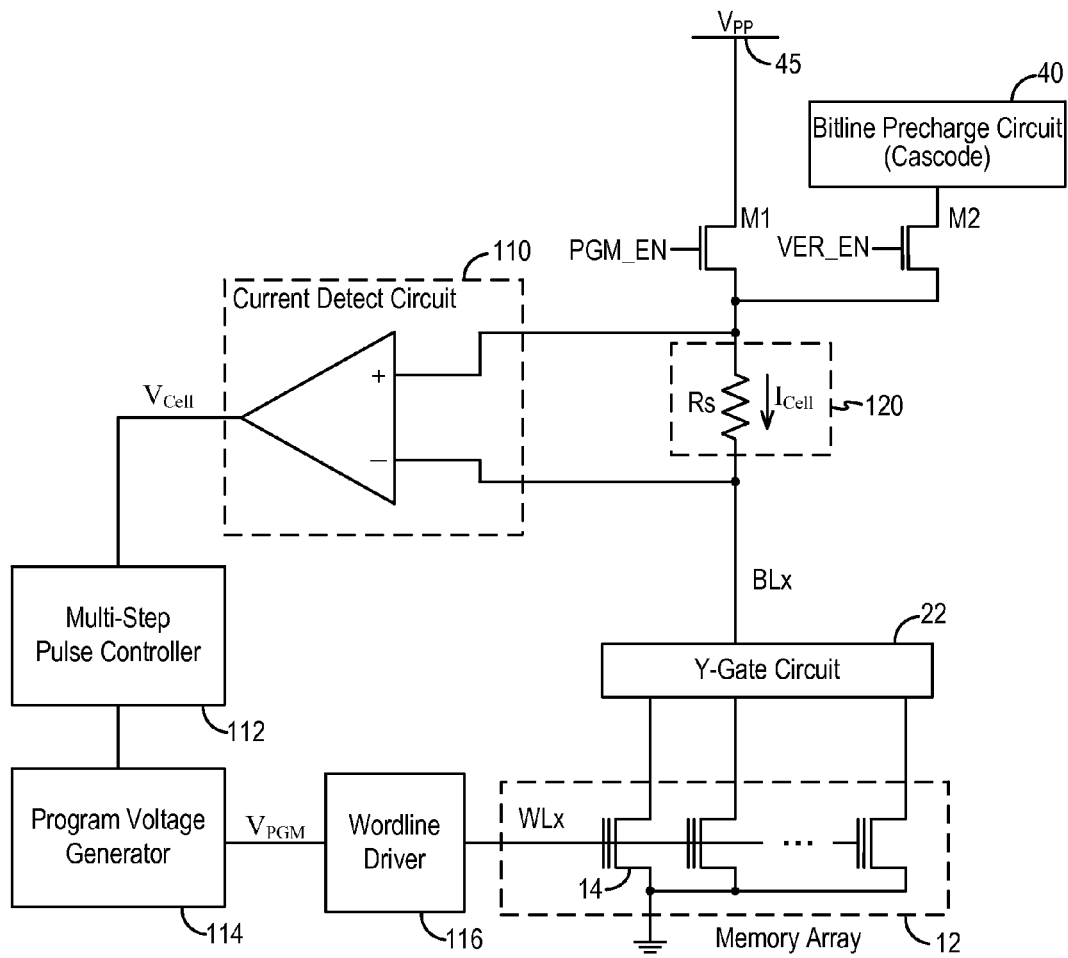
FIG. 5 is a schematic diagram of a portion of the circuitry of the flash memory device of FIG. 1 for implementing the low current auto-verification programming method in embodiments of the present invention.

FIG. 5 is a schematic diagram of a portion of the circuitry of the flash memory device of FIG. 1 for implementing the low current auto-verification programming method in embodiments of the present invention. More specifically, FIG. 5 illustrates primarily the circuitry for performing programming operations in the flash memory device. Other circuitry of the flash memory device not related to the programming operation are omitted to simplify the description. Referring to FIG. 5, a memory cell 14 selected for programming have its associated word line WLx activated by the word line driver 16. The Y-gating circuit 22 connects the drain terminal of the selected memory cell 14 to the bit lines BLx. The bit line BLx is connected to a transistor M1 controlled by a PGM_EN signal which is asserted during programming operation to connect the bit line BLx to a programming voltage Vpp (node 45). For example, the programming voltage Vpp is an elevated voltage generated by a charge pump. During the programming operation, the bit lines are biased to an elevated drain voltage, supplied by the Vpp voltage (node 45). In the present illustration, the bit line BLx is also connected to a transistor M2 controlled by a VER_EN signal which is asserted during verification operation to connect the bit line BLx to a bit line precharge circuit 40. The bit line precharge circuit 40 precharges the bit line for read out operation. In some embodiment, the precharge circuit 40 is implemented as a cascode amplifier stage.

In embodiments of the present invention, a current sense circuit 120 and a current detect circuit 110 is used to measure the cell current flowing in the bit line BLx during the programming of the selected memory cell. In the present example, the current sense circuit 120 is implemented using a resistor $R_S$ connected in series with the bit line BLx to sense the current flowing in the bit line which represents the cell current Icell. The current detect circuit 110 is coupled to the resistor $R_S$ to measure the voltage developed across the sense resistor as a result of the cell current throwing through the resistor. In the present example, the current detect circuit 110 is a differential amplifier configured to measure the voltage difference between the two input terminals of the differential amplifier. The current detect circuit 110 generates a voltage signal Vcell indicative of the current at the sense resistor $R_S$. The use of a sense resistor RS as the current sense circuit 120 and a differential amplifier as the current detect circuit 110 is illustrative only. Other circuitry and methods may be used to measure the cell current flowing through a selected flash memory cell.

The voltage signal Vcell, indicative of the cell current at the selected memory cell 14, is coupled to drive a multi-step pulse controller 112. The multi-step pulse controller 112 controls a program voltage generator 114 in response to the detected cell current level. The program voltage generator 114 generates the programming voltage $V_{PGM}$ to be applied to the control gate of the selected memory cell for programming the memory cell. The programming voltage $V_{PGM}$ is provided to the word line driver 116 which drives the control gate of the selected memory cell to the programming voltage.

In embodiments of the present invention, the multi-step pulse controller 112 and the program voltage generator 114 are configured to generate a series of programming pulses that increase in magnitude over time. The magnitude of the pulses is increased with each successive pulse by a predetermined step size. Accordingly, a series of programming pulses of having increasing voltage values is provided to the selected memory cell to program the memory cell. The programming voltage step size can be increased incrementally from a low programming voltage value to the final programming voltage necessary to program the memory cell to the desired voltage threshold. In the case of a MLC memory cell, the programming voltage step size can be selected for each program state of the MLC memory cell.

In some embodiments, the programming pulses generated by the multi-step pulse controller 112 may increment at the same step size or at different step sizes. For example, the programming pulses may have a smaller step size increase at the beginning and a larger step size increase during the middle of the programming voltage range. Furthermore, the programming pulses generated by the multi-step pulse controller 112 do not necessarily have the same fixed time duration. Rather, the programming pulses may be generated by the controller 112 and the pulses are terminated when a cell current below a given reference level is detected, as explained in more detail below.

Figure 6:
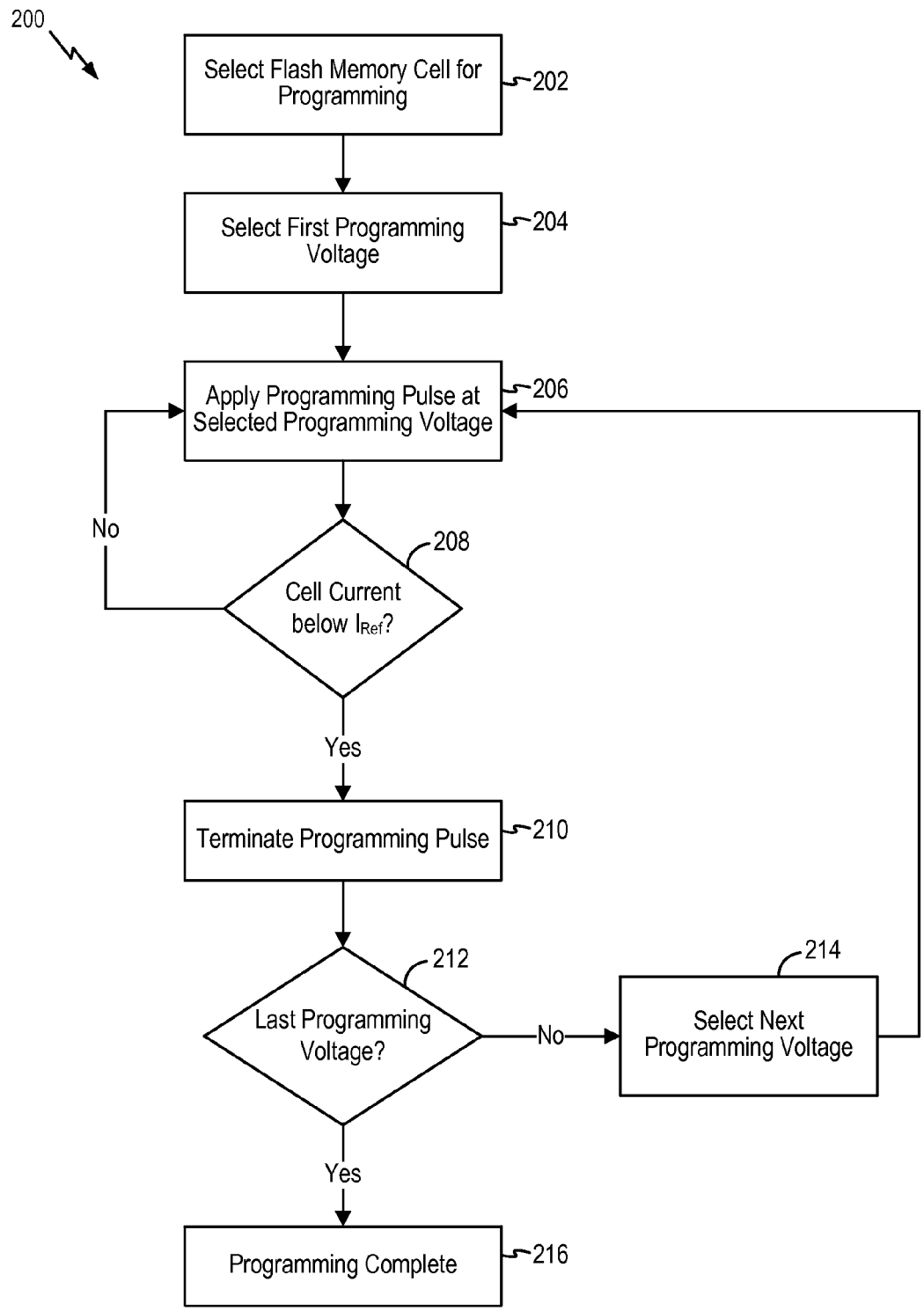
FIG. 6 is a flow chart illustrating a low current auto-verification programming method for flash memory device according to embodiments of the present invention.
Figure 7:
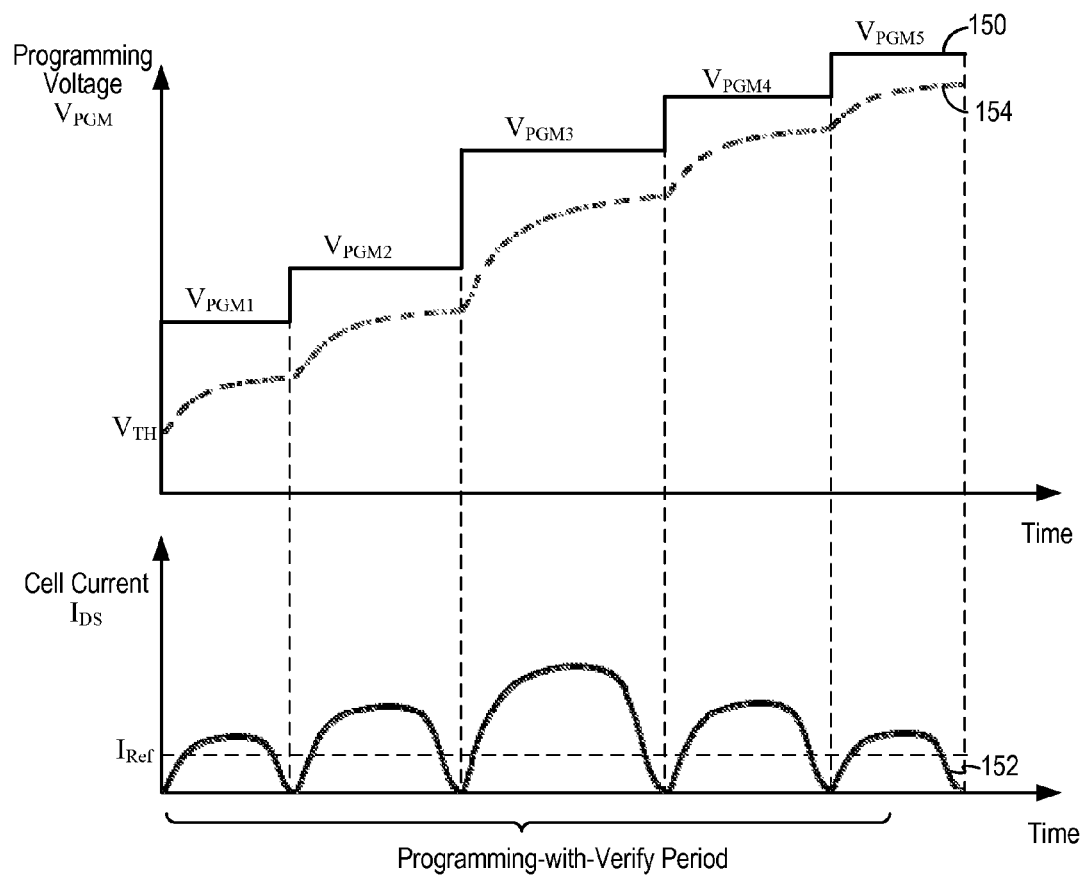
FIG. 7 illustrates the programming signal waveforms used by the low current auto-verification programming method of FIG. 6 in one example.

FIG. 6 is a flow chart illustrating a low current auto-verification programming method for flash memory device according to embodiments of the present invention. In some embodiments, the low current auto-verification programming method of FIG. 6 may be implemented in the flash memory device of FIG. 5. The low current auto-verification programming method will be described with reference to the programming signal waveforms of FIG. 7. Referring to FIGS. 6 and 7, the low current auto-verification programming method 200 starts when a memory cell is selected for programming (202). The method 200 then selects a first programming voltage to be applied to the control gate of the selected memory cell (204). The first programming voltage may be the first voltage value of a series of voltage steps to be applied to program the selected memory cell. FIG. 7 illustrates an example programming voltage step waveform 150. The first programming voltage, for example, may be voltage $V_{PMG1}$ of the first voltage step of waveform 150.

The method 200 then generates and applies a programming pulse at the selected programming voltage to the control gate of the selected memory cell (206). In some embodiments, the programming pulse has a unlimited duration or the programming pulse may have an extended duration. The method 200 measures the cell current of the selected memory cell during the application of the programming pulse and the programming pulse is terminated only when the cell current drops below a given reference current level $I_{Ref}$ (208). In this manner, the programming duration is automatically extended as needed to program the memory cell. Method 200 does not have a fixed duration programming pulse as in the conventional programming methods.

At the application of the programming voltage to the control gate of the memory cell, the memory cell starts to conduct a drain current $I_{DS}$ ("the cell current") as a function of the applied control gate voltage. The drain current $I_{DS}$ is shown as curve 152 in FIG. 7. The cell current remains at the peak current value until the memory cell is programmed, at which point the cell current decreases rapidly down to a low current level. For instance, the cell current of a programmed cell decreases to a level below the reference current level $I_{Ref}$.

When the cell current is above the reference current level $I_{Ref}$ (208), the method 200 repeats at 206 to continue to apply the programming pulse at the selected programming voltage level. However, when the cell current drops below the reference current level $I_{Ref}$ (208), the method 200 terminates the programming pulse (210). At the termination of the programming pulse, there is no need to perform a program-verify cycle as the program state of the memory cell has already been verified by the detection of the drain current.

Then, the method 200 determines if the currently selected programming voltage is the last programming voltage (212). When the currently selected programming voltage is not the last programming voltage, the method 200 then proceeds to select the next programming voltage from the series of voltage steps (214). For example, the programming voltage $V_{PGM2}$ may be selected next. The method 200 then repeats at 206 where a programming pulse at the selected programming voltage is applied to the control gate of the selected memory cell.

The programming of the memory cell continues until the last programming voltage (e.g. $V_{PGM5}$) has been applied to the memory cell. At each voltage step, the programming pulse is applied until the memory cell is programmed. With each successive voltage step, a higher and higher programming voltage is applied to program the memory cell until the memory cell is programmed to the desired threshold level $V_{TH}$ (curve 154) by the last programming voltage. The programming operation is then completed (216).

In embodiments of the present invention, the magnitude of the cell current ($I_{DS}$), or the peak cell current, is a function of the difference between the applied gate bias voltage (the programming voltage $V_{PGM}$) and the memory cell's threshold voltage ($V_{TH}$), that is, the cell current $I_{DS}$ is a function of $V_{PGM}$-$V_{TH}$. When the program voltage steps shown in FIG. 7 are used, the resulting cell current value $I_{DS}$ is as shown by curve 152 in FIG. 7. When the programming step size is the same, such as the programming voltages $V_{PGM1}$ and $V_{PBM5}$, or programming voltages $V_{PGM2}$ and $V_{PBM4}$, the cell current $I_{DS}$ will have the same peak current value, as shown in FIG. 7.

In embodiments of the present invention, the value of the reference current $I_{Ref}$ can be adjusted based on the programming condition. For example, the value of the reference current may be adjusted based on the number of program cells being programmed at the time.

In one example, the low current auto-verification programming method 200 may use a series of programming voltages at 3V, 4V, 6V and 9V. The programming voltages in the series may have the same or different voltage intervals. When the memory cell is programmed at 3V, then a 4V programming pulse is applied. When the memory cell is programmed at 4V, then a 6V programming pulse is applied. The programming continues until the last programming voltage of 9V has been applied and the memory cell is detected to have been programmed.

The low current auto-verification programming method of the present invention uses multi-step programming voltages to facilitate ease of programming. In particular, when a memory cell is not fully programmed at a lower programming voltage, it would be more difficult to program the same memory cell at a higher programming voltage. The programming method of the present invention steps up the programming voltage gradually and ensures that the memory cell is properly programmed at each programming voltage. In this manner, reliable programming of the flash memory cells can be achieved.

The low current auto-verification programming method of the present invention achieves a reduction of the programming current demand by using the multi-step programming voltage. In the conventional programming method, the same large programming voltage is applied to the memory cell repeatedly until the memory cell is programmed. As the cell current of the memory cell is a function of the applied programming voltage, each programming cycle consumes a large amount of current due to the use of the a large programming voltage. When the low current auto-verification programming method of the present invention is used, the programming voltage slowly ramps up and thus the overall current consumption is lower as the peak cell current at the initial voltage steps is lower than it would have been if the same large programming voltage is applied.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method in a non-volatile memory device including an array of memory cells, the method for programming a memory cell in the array of memory cells, the method comprising:
   selecting a memory cell associated with a word line and a bit line for programming;
   selecting a first programming voltage value;
   applying a programming pulse at the selected programming voltage value to the word line of the selected memory cell, the word line being coupled to a control gate of the memory cell;
   sensing a cell current at the selected memory cell as the programming pulse is being applied;
   determining the cell current having decreased below a reference current level;
   terminating the programming pulse in response to the determining;
   selecting a second programming voltage value larger than the first programming voltage value; and
   repeating at applying a programming pulse at the selected programming voltage value using the second programming voltage value as the selected programming voltage value.

2. The method of claim 1, wherein sensing a cell current at the selected memory cell as the programming pulse is being applied comprises: sensing the cell current on the bit line of the selected memory cell.

3. The method of claim 1, wherein the array of memory cells comprises memory cells having a single program state for storing a single bit of data per memory cell.

4. The method of claim 1, wherein the array of memory cells comprises memory cells having multiple program states for storing two or more bits of data per memory cell.

5. The method of claim 1, wherein the reference current level comprises a reference current level as a function of the number of memory cells being programmed at a time.

6. A non-volatile memory device, comprising:
   a two-dimensional array of non-volatile memory cells, each memory cell being adapted to store one bit of data, each memory cell being accessed by a word line and a bit line;
   a word line driver circuit configured to receive a programming pulse at a programming voltage level, the word line driver circuit applying the programming pulse to the word line which is coupled to a control gate of a selected memory cell;
   a current sense circuit coupled to the bit line and configured to sense a cell current flowing in the selected memory cell;
   a current detect circuit configured to measure the sensed current at the current sense circuit and to generate a first signal indicative of the sensed current;
   a multi-step pulse controller configured to generate a programming pulse; and
   a program voltage generator configured to generate a programming voltage for the programming pulse, the program voltage being selected from a first programming voltage value and a second programming voltage value larger than the first programming voltage value.
   wherein the multi-step pulse controller and the program voltage generator are configured to generate a first programming pulse at the first programming voltage value, the first programming pulse being terminated by the first signal having a first value indicating the sensed current is below a reference current level, a second programming pulse having the second programming voltage value being applied following the terminated first programming pulse.

7. The non-volatile memory device of claim 6, wherein the current sense circuit comprises a resistor connected in series with the bit line of the selected memory cell.

8. The non-volatile memory device of claim 7, wherein the current detect circuit comprises a differential amplifier configured to sense a voltage across the resistor as the sensed current.

9. The non-volatile memory device of claim 6, wherein the array of memory cells comprises memory cells having a single program state for storing a single bit of data per memory cell.

10. The non-volatile memory device of claim 6, wherein the array of memory cells comprises memory cells having multiple program states for storing two or more bits of data per memory cell.

11. The non-volatile memory device of claim 6, wherein the reference current level comprises a reference current level as a function of the number of memory cells being programmed at a time.

* * * * *